United States Patent
Nishioka et al.

(10) Patent No.: US 9,887,064 B2
(45) Date of Patent: *Feb. 6, 2018

(54) STAGE DEVICE AND CHARGED PARTICLE BEAM DEVICE USING THE SAME

(71) Applicant: Hitachi High-Technologies Corporation, Minato-ku, Tokyo (JP)

(72) Inventors: Akira Nishioka, Tokyo (JP); Masaki Mizuochi, Tokyo (JP); Shuichi Nakagawa, Tokyo (JP); Nobuyuki Maki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/120,919

(22) PCT Filed: Jan. 7, 2015

(86) PCT No.: PCT/JP2015/050200
§ 371 (c)(1),
(2) Date: Aug. 23, 2016

(87) PCT Pub. No.: WO2015/129292
PCT Pub. Date: Sep. 3, 2015

(65) Prior Publication Data
US 2016/0365219 A1  Dec. 15, 2016

(30) Foreign Application Priority Data
Feb. 25, 2014 (JP) .................... 2014-033536

(51) Int. Cl.
*H01J 37/20* (2006.01)
*H01L 21/687* (2006.01)
(Continued)

(52) U.S. Cl.
CPC ........ *H01J 37/20* (2013.01); *H01L 21/67253* (2013.01); *H01L 21/68* (2013.01);
(Continued)

(58) Field of Classification Search
CPC .. H01J 37/20; H01J 37/18; H01J 37/28; H01J 2237/2801; H01J 2237/202; H01J 2237/2002
(Continued)

(56) References Cited

U.S. PATENT DOCUMENTS 9,368,320 B2* 6/2016 Nishioka ............... H01J 37/20

FOREIGN PATENT DOCUMENTS

| JP | 11-176919 A | 7/1999 |
| JP | 2006-5137 A | 1/2006 |

(Continued)

OTHER PUBLICATIONS

International Search Report (PCT/ISA/210) issued in PCT Application No. PCT/JP2015/050200 dated Apr. 21, 2015 with English-language translation (two (2) pages).
(Continued)

*Primary Examiner* — Nicole Ippolito
(74) *Attorney, Agent, or Firm* — Crowell & Moring LLP

(57) ABSTRACT

To provide a stage device and a charged particle beam device using the same capable of effectively suppressing thermal deformation of a stage generated by temperature increase caused by heat generated by a linear motor. The stage device including a table, a linear motor driving the table in a prescribed direction, in which the table and a moving part of the linear motor are connected by components, a slide unit is attached to the component, movement of which is constrained by a rail fixed to a base, and at the same time, the slide unit is positioned vertically below a
(Continued)

place where the component is joined to the table, thereby suppressing thermal deformation of the table.

11 Claims, 6 Drawing Sheets

(51) Int. Cl.
    *H01L 21/67*     (2006.01)
    *H01L 21/68*     (2006.01)
    *H02K 41/02*     (2006.01)
    *H02K 9/22*     (2006.01)
    *H02K 16/00*     (2006.01)

(52) U.S. Cl.
    CPC ....... *H01L 21/68785* (2013.01); *H02K 41/02* (2013.01); *H01J 2237/2002* (2013.01); *H01J 2237/20221* (2013.01); *H01J 2237/20271* (2013.01); *H01J 2237/20278* (2013.01); *H01J 2237/2801* (2013.01); *H01J 2237/2817* (2013.01); *H02K 9/22* (2013.01); *H02K 16/00* (2013.01)

(58) Field of Classification Search
    USPC ................ 250/440.11, 441.11, 442.11, 443.1
    See application file for complete search history.

(56) References Cited

FOREIGN PATENT DOCUMENTS

| | | |
|---|---|---|
| JP | 2013-106498 A | 5/2013 |
| JP | 2013-137915 A | 7/2013 |

OTHER PUBLICATIONS

Japanese-language Written Opinion (PCT/ISA/237) issued in PCT Application No. PCT/JP2015/050200 dated Apr. 21, 2015 (four (4) pages).

* cited by examiner

[FIG. 2]
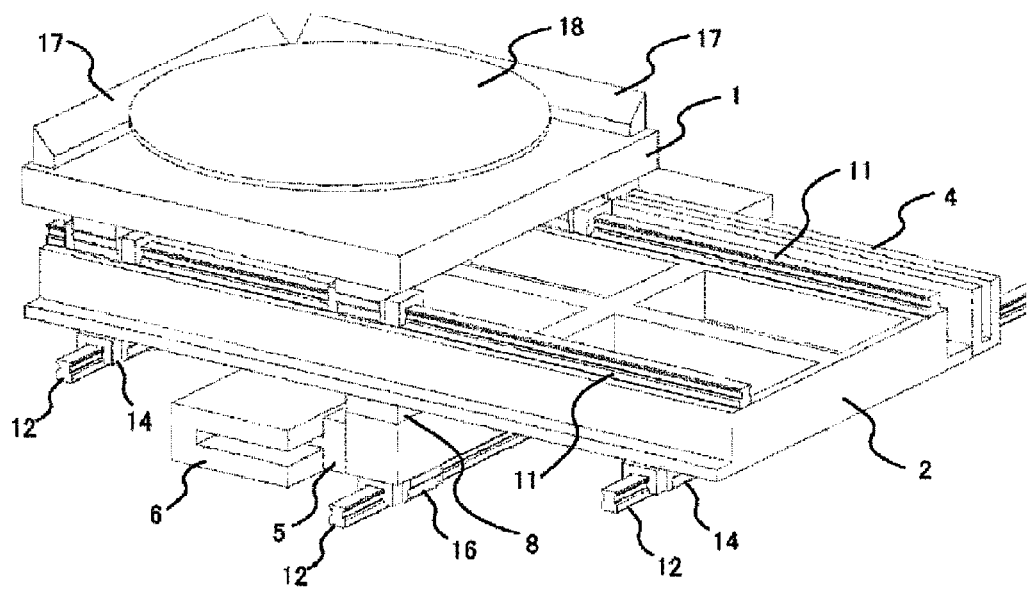
[FIG. 3]
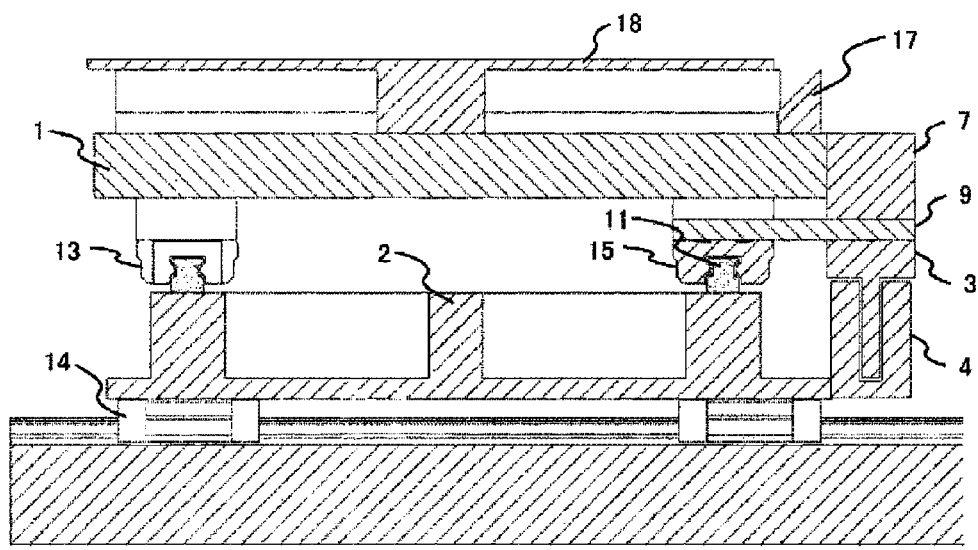

[FIG. 4]
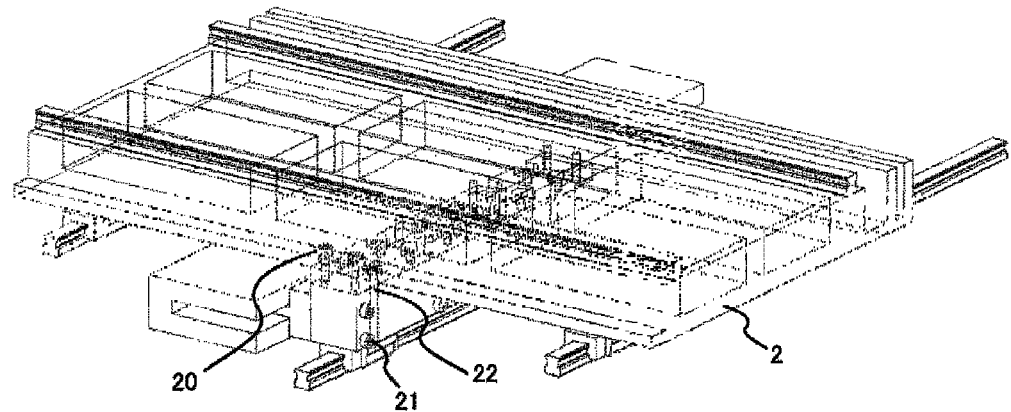
[FIG. 5]
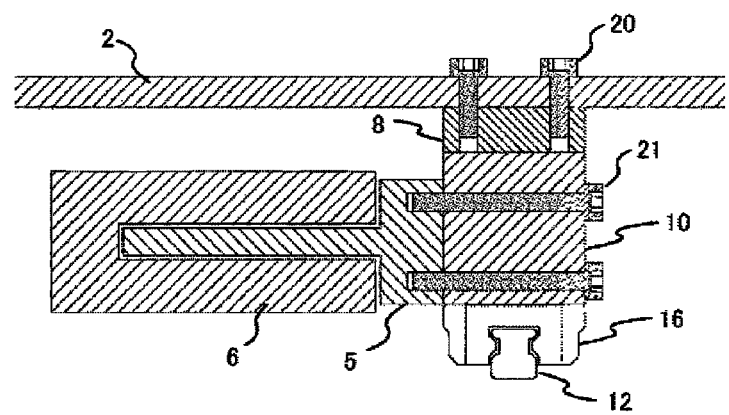
[FIG. 6]
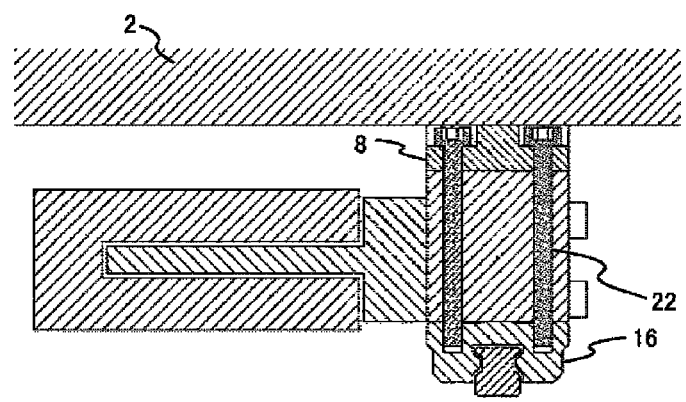

[FIG. 7]
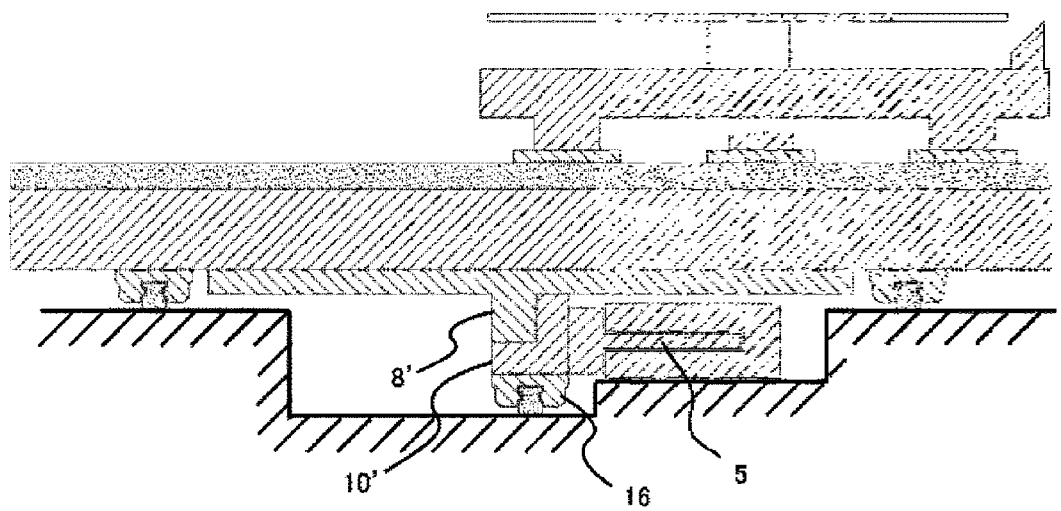
[FIG. 8]
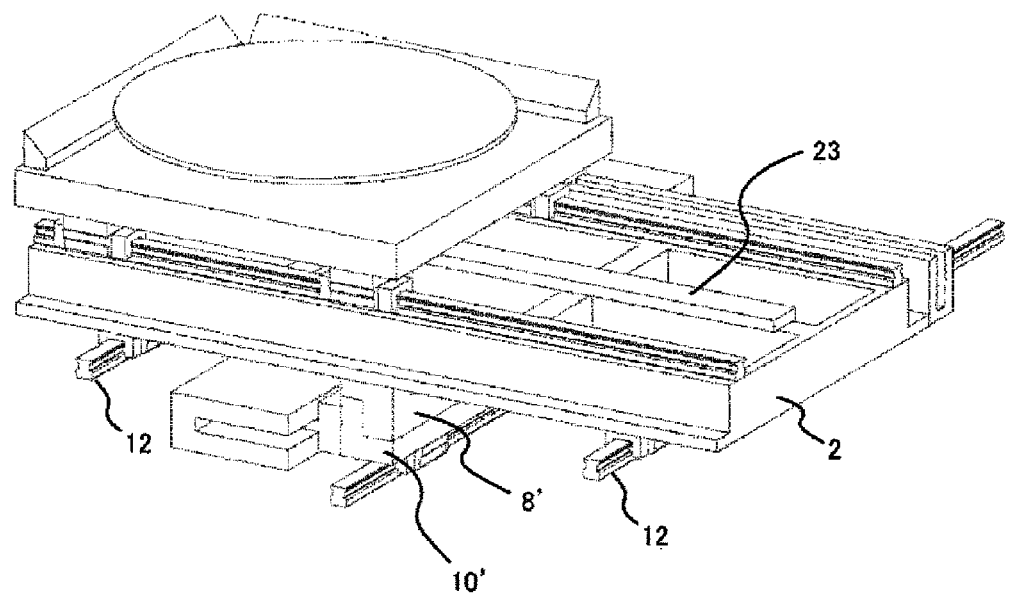

[FIG. 9]
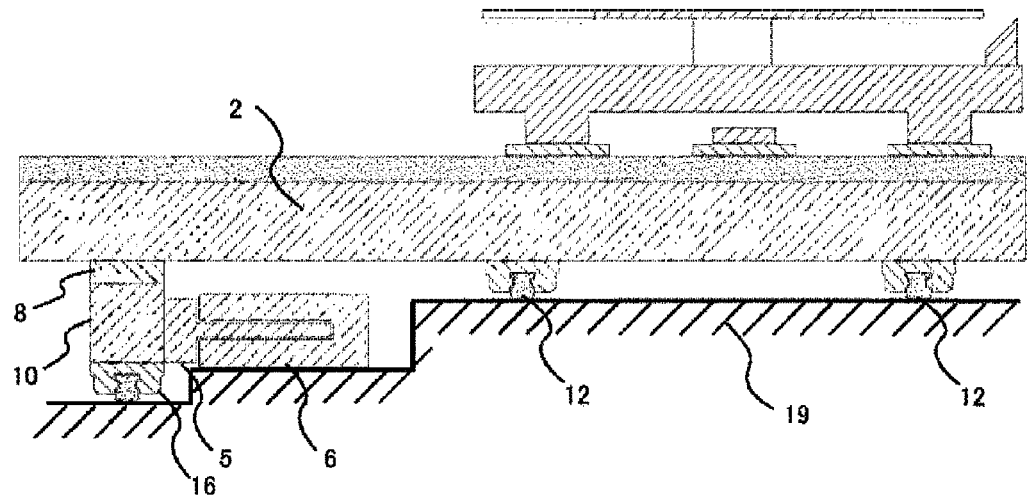
[FIG. 10]
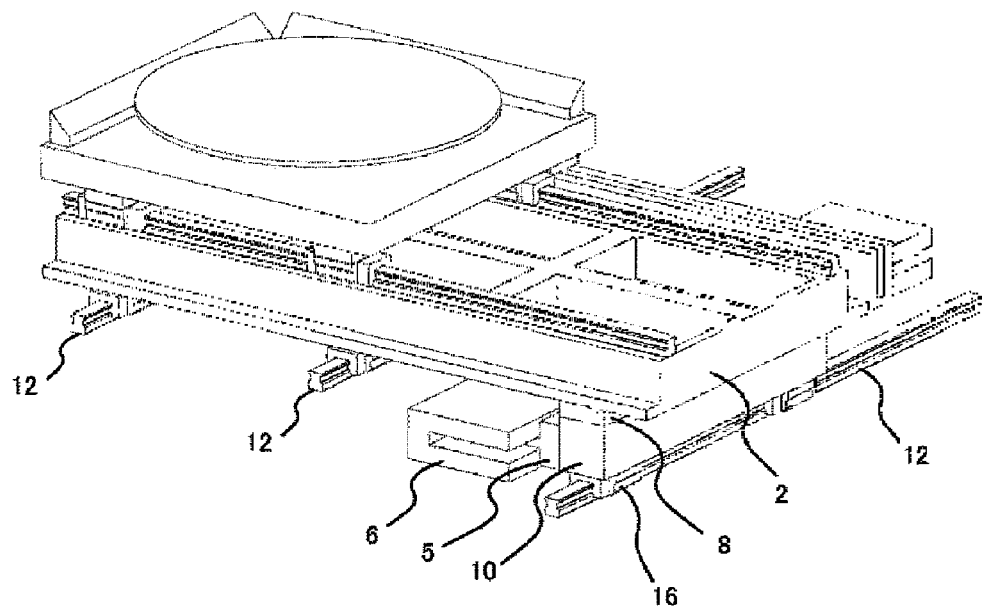

[FIG. 11]
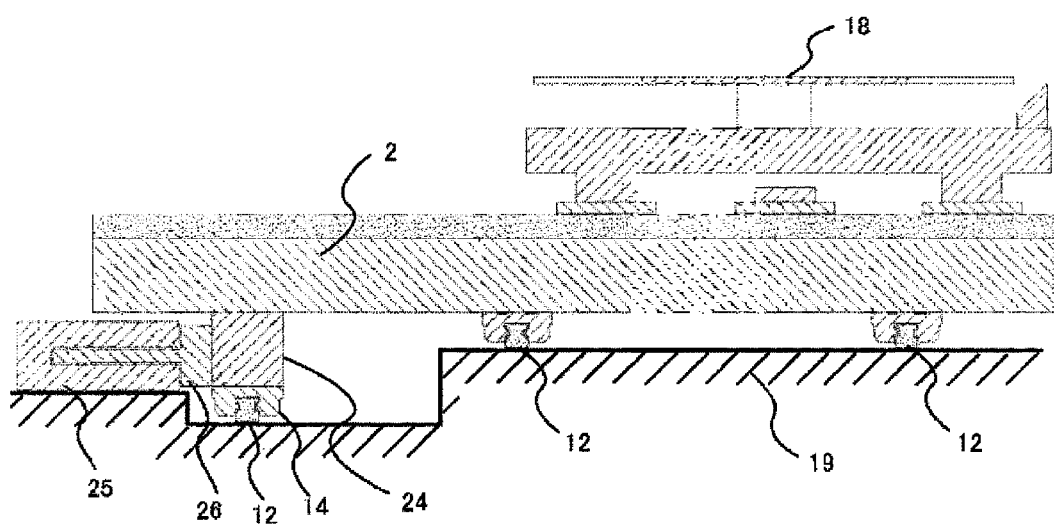

STAGE DEVICE AND CHARGED PARTICLE BEAM DEVICE USING THE SAME

TECHNICAL FIELD

The present invention relates to a stage device and a charged particle beam device using the same, and particularly relates to a stage device and a charged particle beam device suitable for suppressing the influence of heat generated by driving a stage.

BACKGROUND ART

As semiconductor devices have been miniaturized in recent years, not only a manufacturing apparatus but also an inspection device or an evaluation device are required to be highly accurate so as to respond to the above. A scanning electron microscope (hereinafter referred to as a CD-SEM) having a length measurement function is generally used for evaluating whether the geometry of a pattern formed on a semiconductor wafer is correct or not. In the CD-SEM, an electron beam is applied onto the wafer, an obtained secondary electron signal is image-processed and an edge of the pattern is discriminated from variation of light and shade to derive dimensions.

The semiconductor wafer is mounted on an XY stage, and the stage device is moved to thereby change positions to which the electron beam is applied and to perform inspections of various positions on the wafer. The positions to be inspected on the wafer can be discriminated by measuring positions of the stage. As a means for increasing the measurement accuracy, there exist a means using a mirror bar and a laser interferometer as shown in Patent Literature 1 and so on.

In Patent Literature 1, there is disclosed a means for adjusting positions by correction as countermeasures for deterioration of position accuracy due to occurrence of thermal deformation by temperature change of the stage and change between the stage and the mirror for the laser interferometer in the stage device using a linear motor.

CITATION LIST

Patent Literature

Patent Literature 1: JP-A-2006-5137

SUMMARY OF INVENTION

Technical Problem

There is a mechanism using a linear motor as a typical mechanism for creasing a linear motion of the XY stage. However, the stage device have to be arranged in a vacuum in devices which use a charged particle beam such as the CD-SEM. On the other hand, Joule heat is generated when electric current flows in a coil for driving the linear motor. Though heat can be released by transmitting the heat to the air in the case where the coil is placed in the air, it is difficult to release the heat in vacuum as the heat is not transmitted to the air and the temperature tends to increase. When a permanent magnet is used as a moving part, a magnetic field changes due to the movement of the permanent magnet, which may affect the charged particle beam. As countermeasures for the magnetic field, the permanent magnet is used as a stator and the coil is used as the moving part to solve the problem. As the coil is used as the moving part in that case, it is necessary to fix the coil to the stage. When the coil is integrally connected to the stage, heat generation of the coil is easily transmitted to the stage, which causes temperature increase of the stage.

It has been cleared as a result of a study by inventors that the stage may be deformed due to the temperature increase of the stage. In the case where the measurement in high magnification such as in the CD-SEM is performed, slight deformation of the stage may be factors of reduction in measurement accuracy and visual field deviation. There is no description in Patent Literature 1 about a means for suppressing the stage deformation. A stage device for effectively suppressing the stage deformation due to temperature increase of the stage is proposed as described below.

Solution to Problem

According to an embodiment of the invention, there is provided a stage device having a first table for placing a sample, a first drive mechanism moving the first table in a first direction, a second table for placing the first table and a second drive mechanism moving the second table in a second direction, which includes a rail guiding the second table to the second direction, a slide unit moving on the rail, and a connecting member interposed between the second table and the second drive mechanism, in which the connecting member and the slide unit are arranged so that a virtual straight line extending in a third direction orthogonal to the first direction and the second direction passes therethrough, and there is also provided a charged particle beam device.

According to another embodiment of the invention, there is provided the stage device in which the connecting member is formed by two or more members having different thermal conductivities, and a member having a relatively higher thermal conductivity in the two members is arranged closer to the slide unit than to the table, and there is also provided a charged particle beam device.

According to further another embodiment of the invention, there is provided a stage device having a first table for placing a sample, a first drive mechanism moving the first table in a first direction, a second table for placing the first table and a second drive mechanism moving the second table in a second direction, which includes a first rail and a second rail guiding the second table to the second direction, a third rail guiding the second table to the same direction as the first rail and the second rail, a slide unit moving on the third rail together with the second table and a connecting member interposed between the second table and the second drive mechanism, in which the connecting member and the slide unit are arranged so that a virtual straight line extending in a third direction orthogonal to the first direction and the second direction passes therethrough, and there is also provided a charged particle beam device including the same.

Advantageous Effects of Invention

According to the above structure, it is possible to effectively suppress deformation caused by temperature increase of the stage.

BRIEF DESCRIPTION OF DRAWINGS

FIG. 2 is a perspective view of Embodiment 1.

FIG. 3 is a cross-sectional view showing a thermal bypass structure of an upper stage according to Embodiment 1.

FIG. 4 is a perspective view showing a method of connecting a bolt according to Embodiment 1.

FIG. 5 is a cross-sectional view showing a method of connecting a bolt according to Embodiment 1.

FIG. 6 is a view of another section showing a method of connecting a bolt according to Embodiment 1.

FIG. 7 is a structure view of a stage device used for a charged particle beam device (Embodiment 2).

FIG. 8 is a perspective view of Embodiment 2.

FIG. 9 is a structure view of a stage device used for a charged particle beam device (Embodiment 3).

FIG. 10 is a perspective view of Embodiment 3.

FIG. 11 is a structure view of a stage device used for a charged particle beam device (Embodiment 4).

DESCRIPTION OF EMBODIMENTS

Figure 1A:
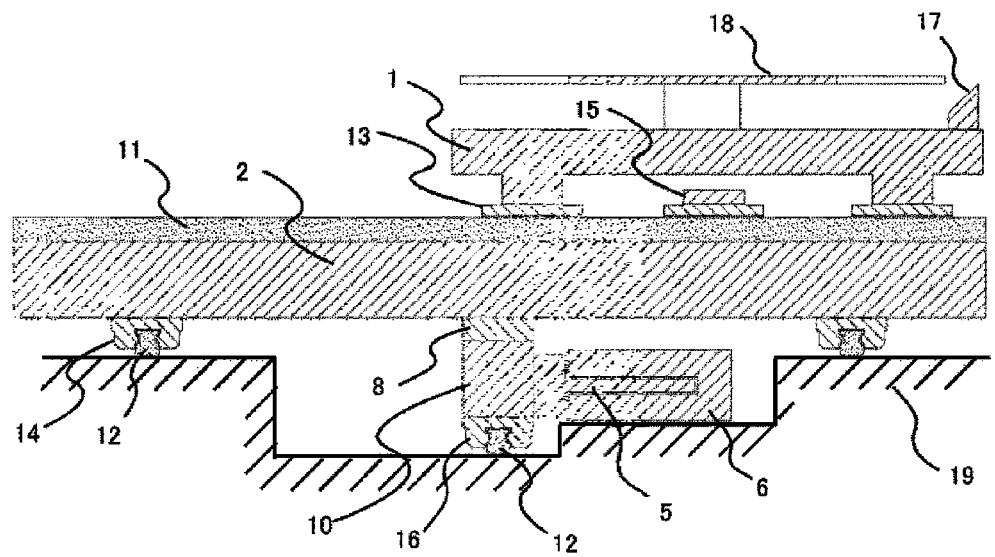
FIGS. 1A and 1B are structure views of a stage device used for a charged particle beam device (Embodiment 1).

An embodiment explained below relates to a stage device chiefly used for a charged particle beam device and so on. For example, a DR-SEM (Defect Review-SEM) which reviews a defect based on information of coordinates of a defect obtained by a CD-SEN or a host defect inspection defect used for evaluating the quality of semiconductor devices is a typical example of the charged particle beam device. Such device includes a stage device for evaluating a minute pattern or a defect formed on a large-sized sample such as a semiconductor wafer. There are several thousands of patterns to be measured particularly in the CD-SEM of recent years, and it is anticipated that the influence of heat generated from a driving source which drives the stage is significant. When the temperature of the stage changes, the stage is deformed due to the influence of thermal expansion and an error occurs in measurement of positions of the stage. Even when the accuracy is increased by making a correction at the time of specifying the position in a system specifying the position by measurement of a distance using a mirror bar and a laser interferometer, a residual error occurring after the correction is increased if an unknown error is large, therefore, it is desirable to reduce thermal deformation itself of the stage.

Although the method of measuring the distance using the mirror bar and the laser interferometer can obtain high measurement accuracy, a path of laser light for measurement changes when an angle of a reflection surface of the mirror bar changes, as a result, an error occurs in measurement values. There are various types of error factors in errors occurring in position measurement due to thermal deformation of the stage. The inventors have found by various considerations that the error occurring by change of the angle of the mirror bar due to thermal deformation of the stage has a large influence among the various errors. Accordingly, in the stage device using the linear motor as the driving source and the system adopting the distance measurement using the mirror bar and the laser interferometer, it is effective to reduce the angle change of the mirror bar occurring due to thermal deformation of the stage, and a structure of realizing the above is required.

In embodiments explained below, in a device in which an object placed in vacuum is irradiated with a charged particle beam, the object is fixed to a stage and the stage is moved to thereby change the position of the object irradiated by charged particles, examples of structures of the stage device will be explained. The device has a structure in which a slide unit is fixed to a table holding the object and the slide unit moves while being constrained by the rail. The device also has a structure in which the stage has upper and lower two stages to allow movement in biaxial directions and a slide unit is connected to a component which connects between a lower-stage table and a moving part of a linear motor driving the table, and the slide unit is constrained by a rail fixed to a base. The device also has a structure in which the slide unit is arranged in a region where a place connecting to the lower-stage table is projected vertically to a plane on which the stage move.

When the above structures are used, the slide unit attached to the component connecting between the lower-stage table and the linear motor moving part can suppress thermal deformation of the stage device, which improves accuracy in position measurement of the stage.

Hereinafter, embodiments will be explained with reference to the drawings.

Embodiment 1

Figure 1B:
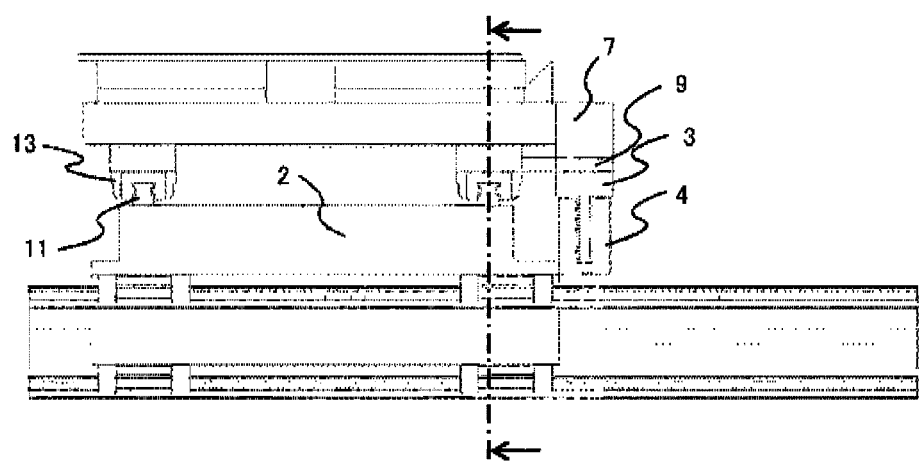

FIG. 1(A) is a cross-sectional view showing a structure of a stage device used for a charged particle beam device according to a first embodiment. FIG. 1(B) is a front view of the same stage device which is seen perpendicular to a moving direction of an upper stage. Lines indicated by arrows in FIG. 1(B) show a position of the cross-section of FIG. 1(A), and the arrows show a direction of the drawing.

The stage device shown in FIG. 1 as an example is built in a vacuum chamber of a scanning electron microscope. On the vacuum chamber, a charged particle beam column for irradiating a semiconductor wafer placed on a table of the stage device with a beam. Abeam source which discharges a charged particle beam into a space where a vacuum state is kept, an extraction electrode for extracting the beam from the beam source, an accelerating electrode which accelerates the beam extracted from the beam source by the extraction electrode, a focusing lens which focuses the beam accelerated by the accelerating electrode and a scanning deflector for scanning the beam on a sample are built in the charged particle beam column.

In FIG. 1(A), a lower stage moves in a direction perpendicular to the paper and the upper stage moves in a direction parallel to the paper. The upper stage moves in a state where a slide unit 13 is attached to a table 1, while being constrained by a rail 11 fixed to a lower-stage table 2. A chuck 18 is fixed to the table 1, on which the wafer is placed. A bar mirror 17 is attached to the table 1 and the laser is applied to a reflection surface thereof, thereby measuring the position of the stage and thus capturing the position of the wafer. The linear motor driving the upper stage is configured by a coil 3 and a permanent magnet 4. The permanent magnet 4 is fixed to the lower-stage table 2 to be used as a stator, and the coil 3 is used as a moving part. When the upper-stage table 1 is connected to the moving part 3 of the linear motor, a connecting component 7 and a thermal bypass component 9 are interposed. A material having a low thermal conductivity is used for the connecting component 7 and a material having a high thermal conductivity is used for the thermal bypass component 9. Resin and so on are suitable as the material used for the connecting component 7, aluminum alloys or copper alloys are suitable as the material used for the thermal bypass component 9. The thermal bypass component 9 is connected to a slide unit 15, and the slide unit 15 contacts the rail 11 fixed to the lower-stage table 2, thereby promoting heat release to the lower-stage table. Accordingly, it is possible to suppress heat generated by the coil 3 of the linear motor transmitting to the table 1 and to reduce the temperature increase of the table 1. When the temperature increase of the table 1 can be reduced, the temperature increase of the chuck 18 connected to the table 1 can be also reduced, and it is possible to prevent temperature difference from being generated between the chuck 18 and the wafer to be placed thereon.

The lower stage moves in a state where a slide unit 14 is attached to the table 2, while being constrained by a rail 12 fixed to a base 19. The linear motor driving the lower stage is configured by a coil 5 and a permanent magnet 6. The permanent magnet 6 is fixed to the base 19 to be used as a stator, and the coil 5 is used as a moving part.

When the lower-stage table 2 is connected to the moving part 5 of the linear motor, a connecting component 8 and a thermal bypass component 10 are interposed. A material having a low thermal conductivity is used for the connecting component 8 and a material having a high thermal conductivity is used for the thermal bypass component 10. Aluminum alloys or copper alloys are suitable as the material used for the thermal bypass component 10 in the same manner as in the upper stage. Resin or ceramic materials are suitable as the material used for the connecting component 8. As ceramic materials generally have smaller linear expansion coefficients, the use of ceramic materials also contributes to the suppression of thermal deformation of the lower-stage table. However, resin materials have smaller conductivities than ceramic materials, therefore, it is preferable to select the material in accordance with conditions as resin materials are more suitable when giving priority to the suppression of heat transmission. The thermal bypass component 10 is connected to a slide unit 16 just below, and the slide unit 16 contacts the rail 12 fixed to the base 19, thereby promoting heat release to the base. At the same time, the slide unit 16 is arranged just below a region where the connecting component 8 contacts the table 2, thereby suppressing deformation due to thermal expansion of the table 2. The transmission of heat generated by the coil 5 of the linear motor to the table 2 is also suppressed, and temperature increase of the table 2 is also reduced. The device according to the embodiment includes upper and lower two-stage tables and two drive mechanisms moving respective tables as described above.

FIG. 2 shows the same device as in FIG. 1 in a perspective view. There are two bar mirrors 17 attached to the upper-stage stable 1, which are arranged so that respective reflection surfaces are perpendicular to a moving direction of the upper-stage table and a moving direction of a lower-stage table to be used for measuring respective movement distances.

The lower-stage table 2 is provided with grooves having carved shapes from an upper surface. The grooves do not penetrate, and lower surfaces are filled with material surfaces, which keeps rigidity in a planar direction. Ribs remaining at the time of forming the grooves have forms connecting in a vertical direction with respect to the rails 12 of the stage, which keeps rigidity with respect to bending deformation in a surface vertical to the rails 12.

FIG. 3 is a cross-sectional view of the same device, which is a cross section taken along a plane perpendicular to the moving direction of the upper stage, showing the cross sectional view at a position crossing the thermal bypass component 9. The thermal bypass component 9 contacts the connecting component 7, the coil 3 and the slide unit 15 only, and does not contact the table 1. Accordingly, the transmission of heat generated by the coil 3 to the table 1 is suppressed.

As the principle that position accuracy of the stage is improved by the above structure, not only the temperature increase of the stage is suppressed and the thermal expansion amount causing thermal deformation is reduced by promoting heat release due to the above thermal bypass structure but also the structure responding to primary deformation modes of thermal expansion contribute to the improvement. This will be explained, returning to FIG. 1(A).

When an XY stage is used inside a vacuum vessel, heat generated in the linear motor have to be released on the base side through a contact portion between the slide unit and the rail, therefore, both the heat generation of the linear motor for the upper stage and the heat generation of the linear motor for the lower stage lead to the temperature increase of the table 2 of the lower stage. Although the thermal bypass structure for the lower stage has an effect of reducing heat transmission to the lower table 2, it is difficult to completely remove the transmitted heat as long as the table is fixed and connected. When the temperature is increased to some degree in the table 2 by the heat generated by the linear motor, thermal expansion which is derived by a product between a linear expansion coefficient set according to the material of the stage and a temperature increase amount occurs. When the thermal expansion occurs in a state where the stage 2 is not constrained, the expansion will be entirely uniform, and the shape does not change except that the size is increased. However, the movement of the table 2 is constrained by the rails 12. The rails 12 are fixed to the base 19, therefore, the base does not expand and positions of the rails 12 do not change if the temperature of the base 19 does not change. The entire temperature change should be avoided in the accurate device such as the charged particle beam device. The temperature of the base portion forming the vacuum vessel is kept so as not to change. In the case where the positions of the rails 12 do not change while the stage 2 is thermally expanded, thermal stress occurs in the stage 2. When focusing attention only to two rails on both sides in three rails 12 shown in FIG. 1(A) while ignoring the central rail 12, the expansion of the stage 2 leads to movement of the rails in right and left directions on the paper through the slide unit. The rails are actually fixed and do not move, therefore, a reaction force of moving the slide units to the central direction is generated in two rails on both sides. As the reaction force is generated on a lower surface side of the stage 2, the force acts on the stage 2 as a moment force, which causes deformation in which the central part of the stage 2 swells upward. That is, when the thermal expansion of the stage 2 is constrained by the rails on both sides, bending stress is caused in the stage 2. In the case where the central rail which has been ignored in the above explanation exists under the above stress condition, it is useful for suppressing deformation in which the central part of the stage 2 swells upward. That is, when the slide unit 16 the movement of which is constrained is connected to a region in which the surface where the stage 2 is connected to the connecting component 8 is vertically extended, displacement in the vertical direction is suppressed. As the slide unit 16 is constrained by the central rail, it is not easily displaced in the upper direction. As the slide unit 16 is connected to the table 2 through the components 10, 8, the connected place is not easily displaced in the upper direction. In order to utilize the above efficiently, it is effective to apply the force vertically to a surface on which the force acts.

Accordingly, to arrange the slide unit in the region where the surface on which the stage 2 is connected to the component 8 is projected in the displacement direction to thereby suppress the displacement by the slide unit will be an effective means. As described above, the two rails 12 (the first rail and the second rail) installed at positions close to end portions of the stage 2 and the slide units 14 regulate the movement of the stage 2 in the direction perpendicular to a guiding direction of these rails. Therefore, when the stage 2 is thermally expanded, portions near the central part of the stage 2 is displaced in a third direction perpendicular to a first direction as the moving direction of the upper-stage table 1 and a second direction as the moving direction of the lower-stage table 2 (when the first direction is X-direction and the second direction is Y-direction, the third direction is Z-direction). Therefore, it is preferable to provide a displacement regulation member in a lower part of the stage center which is considered to be displaced to the largest degree for regulating the displacement in the Z-direction. That is, a connecting member and a connecting surface such as the component 8 and the thermal bypass component 10 which connect between the lower-stage table 2 and the slide unit 16 are arranged on a virtual straight line extending in the third direction. The component 8, the thermal bypass component 10 and the slide unit 16 are arranged so that the third virtual straight line passes therethrough as described above, thereby applying the effect of regulating displacement in directions other than the slide direction of the slide unit 16 to the regulation of displacement caused by the thermal expansion of the stage.

Furthermore, the component 8 and the thermal bypass component 10 interposed between the driving source (coil 5) to be a heat source causing deformation of the stage 2 and the stage 2 are respectively formed of a member having a relatively low thermal conductivity and a member having a relatively high thermal conductivity, thereby obtaining a state where the heat is hardly released to the stage's side and the heat is easily released to the base's side. According to such structure, the heat generated by the coil 5 can be effectively released through the slide unit 16 and the rail 12.

The principle that the suppression of deformation in which the central part of the stage 2 swells upward leads to the improvement of accuracy in position measurement of the stage is as follows. When the center part of the stage 2 swells upward, the rails 11 fixed to the stage 2 are deformed in the similar manner. As the upper stage moves along the rails 11, the deformation of the rails 11 leads to change of the posture of the table 1. That is, in the case where the central part of the rail swells upward, the table 1 will be in a posture of slanting to the right when the table 1 is positioned right of the central part, and the table 1 will be in a posture of slanting to the left when the table 1 is positioned left of the central part. Accordingly, the posture changes according to where the table 1 is positioned. The bar mirrors are fixed to the table 1, therefore, the posture change of the table 1 is directly linked to change of angles of the bar mirrors. When the angle of the reflection surface of the bar mirror changes, an error occurs in distance measurement. In particular, the variation of angles differs according to positions of the stage 1, it is difficult to correct the error, therefore, the suppression of change in angles of the bar mirrors by the structure according to the invention is highly useful to the improvement of accuracy in position measurement of the stage. An effective bolt fastening structure used at the time of installing the connecting component 8 and the thermal bypass component 10 for achieving the first embodiment is shown in FIGS. 4, 5 and 6.

FIG. 4 is a perspective view showing only the lower stage, which is shown in a transparent manner. FIG. 5 is a view showing a cross section of a bolt 20 for joining the connecting component 8 to the lower-stage table 2. FIG. 6 is a view showing a cross section of a bolt 22 joining the connecting component 8 to the thermal bypass component 10 and the slide unit 16.

As shown in FIG. 5, the bolt 20 is provided so as to contact only the lower-stage table 2 and the connecting component 8 and so as not to contact the thermal bypass component 10. According to the structure, heat transmission from the thermal bypass component to the lower-stage table 2 through the bolt 20 is prevented. The bolt 20 is preferably formed of a metal material for securing the strength, and the metal has generally a high thermal conductivity. The heat is transmitted due to the metal connection by the bolt even when a resin material or a ceramic material is used for the connecting component 8 to reduce the thermal conductivity, therefore, the adoption of the structure shown in FIG. 5 is effective. However, the connecting component 8 and the thermal bypass component 10 are not capable of being joined only by the above structure, therefore, a structure shown in FIG. 6 is adopted. That is, a seat which can hold a head of the bolt 22 of the connecting component 8 is formed by carving, then, the connecting component 8 and the thermal bypass component 10 are joined by the bolt 22. At the same time, the thermal bypass component 10 and the slid unit 16 are also joined by the bolt 22. The bolt 22 does not contact the lower-stage table 2 as the carved portion holding the head of the bolt 22 is provided in the connecting component 8. Accordingly, the transmission of heat generated by the coil 5 to the lower-stage table 2 can be prevented. The connection between the coil 5 and the thermal bypass component 10 is performed by a bolt 21 as shown in FIG. 5. According to these structures, the transmission of heat to the table 2 can be suppressed while transmitting the thrust of the moving part 5 is positively transmitted to the table 2. It is also possible to arrange the slide unit 16 in a compact manner, which has two functions of releasing heat generation of the coil 5 to the base and suppressing thermal deformation of the table 2.

Embodiment 2

FIG. 7 and FIG. 8 show a structure of a stage device used for a charged particle beam device according to a second embodiment. The explanation of the same structures as those of the first embodiment is omitted, and only structures different from those will be explained.

FIG. 7 is a cross-sectional view taken in the same manner as FIG. 1. In the structure of FIG. 7, a thermal bypass component 10' connecting to the coil 5 for the lower-stage and a component 8' connecting to the lower stage 2 differ from those of the first embodiment. As the thermal bypass component 10' is formed in an L-shape, the wall thickness in the right and left direction of the paper is reduced. The thermal bypass component has a function of allowing the heat to flow in the slide unit 16, therefore, it is preferable to use a material having a high thermal conductivity for the thermal bypass component. On the other hand, it is desirable that heat generation by the coil 5 is not easily transmitted to the table 2. Accordingly, the reduction in wall thickness of an upper side of the thermal bypass component 10' effectively works. That is, the cross-sectional area of a heat transmission path is reduced when the wall thickness is reduced, which is effective for suppressing the heat transmission amount. The reduction in rigidity due to the reduction in wall thickness is compensated by the component 8' which has a lower thermal conductivity. That is, the reduction in rigidity is prevented by filling a reduced space with the component 8'.

The connecting component 8' is formed of a resin material and formed so that a surface joined to the lower-stage table 2 becomes wide, thereby contributing to suppression of thermal deformation in the lower-stage table 2. As resin materials generally have larger linear expansion coefficients than metal materials, when the lower-stage table 2 is formed of the metal material, the fact that the connecting component 8' is formed of the resin means that the linear expansion coefficient is larger than the lower-stage table 2. As the component having the larger linear expansion coefficient is joined to a lower surface side, the lower surface side swells larger, which may lead to a deformation in which both ends are lifted upward and the central part sinks downward. On the other hand, the deformation caused by temperature increase of the lower-stage table 2 is a bending in which the central part swells upward. Accordingly, both thermal stresses repel each other and the deformation in which the central part of the lower-stage table 2 swells upward is suppressed.

Furthermore, to join a plate 23 made of a ceramic material on an upper surface of the lower-stage table 2 as shown in FIG. 8 can also contribute to suppression of the deformation in which the lower-stage table 2 swells upward. In this case, the ceramic plate 23 is formed in a longer shape in the perpendicular direction with respect to the rails 12 for the lower stage. That is, the thermal deformation of the lower table 2 is generated by a reaction force of the rails 12, therefore, it is effective that the plate is formed to be longer in the same direction as the reaction force for generating the force of a direction which cancels the reaction force. As ceramic materials generally have small linear expansion coefficients than metal materials, therefore, if the same temperature increase occurs in the table 2 and the ceramic plate 23, the extension caused thereby will be smaller in the ceramic plate 23. Accordingly, the force in the direction contracting the upper surface acts on the table 2, and the force in the direction sinking the central part downward is generated. As a result, it is possible to suppress the bending of the table 2.

Embodiment 3

FIG. 9 and FIG. 10 show a structure of a stage device used for a charged particle beam device according to a third embodiment. In the embodiment, the position of the linear motor for the lower stage is changed from the center to an end position. When the linear motor is arranged at the end, a carved portion does not exist in the central part of the base 19, which may be effective for rigidity of the base 19 forming the vacuum vessel. Moreover, concerning the suppression of deformation in which the center of the table 2 swells upward, the normal rail 12 for constraining the movement of the table 2 is arranged at the center, therefore, lengths of interposed components are reduced and extensions of interposed components are reduced, which are more effective for suppressing the deformation of the table 2.

Embodiment 4

FIG. 11 shows a structure of a stage device used for a charged particle beam device according to a fourth embodiment. The embodiment is the same as the above embodiments in a point that a moving-coil type linear motor is used for the linear motor of the upper stage, however, the embodiment differs from them in a point that a moving-magnet type linear motor is used for the linear motor of the lower stage. When the moving-magnet type is adopted, a magnetic field varies, which is disadvantageous in dealing with the charged particle beam. In order to solve the above, the linear motor for the lower stage is arranged at the end. The charged particle beam is dealt with over the wafer placed on the chuck, therefore, it keeps a distance to a moving magnet 26 in both the vertical direction and the horizontal direction to prevent adverse effect. As the moving-magnet type is used for the linear motor of the lower stage, the magnet is used as the moving part 26, and a coil 25 is fixed to the base 19. According to the structure, the heat generation of the coil 25 is directly transmitted to the base 19 and is not transmitted to the table 2. Therefore, the temperature increase of the table 2 is reduced and the thermal deformation is reduced. As the moving part 26 does not generate heat, just one component 24 is required for connecting between the moving part 26 to the table 2. Furthermore, the connecting component 24 can be formed of a metal material as there is no constraint of heat. However, the temperature increase of the stage due to the heat generation of the linear motor for the upper stage remains, therefore, it is effective to vertically arrange the connecting component 24 and the slide unit 14 for suppressing thermal deformation of the table 2.

REFERENCE SIGNS LIST

1 upper-stage table
2 lower-stage table
3 coil (moving part) of linear motor for upper stage
4 magnet (stator) of linear motor for upper stage
5 coil (moving part) of linear motor for lower stage
6 magnet (stator) of linear motor for lower stage
7 component for connecting upper-stage table
8 component for connecting lower-stage table
9 thermal bypass component for upper-stage table
10 thermal bypass component for lower-stage table
11 rail for upper stage
12 rail for lower stage
13 slide unit for upper stage
14 slide unit for lower stage
15 slide unit for upper stage thermal bypass
16 slide unit for lower stage thermal bypass
17 mirror bar
18 chuck
19 base
20-22 bolt
23 ceramic plate
24 lower-stage table connecting component
25 coil (stator) of linear motor for lower stage
26 magnet (moving part) of linear motor for lower stage

The invention claimed is:

1. A stage device including a first table for placing a sample, a first drive mechanism moving the first table in a first direction, a second table for placing the first table and a second drive mechanism moving the second table in a second direction, the device comprising:
   a rail guiding the second table to the second direction;
   a slide unit moving on the rail; and
   a connecting member interposed between the second table and the second drive mechanism,
   wherein the connecting member and the slide unit are arranged so that a virtual straight line extending in a third direction orthogonal to the first direction and the second direction passes therethrough.

2. The stage device according to claim 1,
   wherein the connecting member is formed by two or more members having different thermal conductivities, and a member having a relatively higher thermal conductivity in the two members is arranged closer to the slide unit than to the table.

3. The stage device according to claim 1, wherein the drive mechanism is a linear motor.

4. The stage device according to claim 3, wherein the linear motor includes a coil and a permanent magnet, and the coil corresponds to a moving part.

5. The stage device according to claim 1, wherein a component connecting a motor moving part driving the second table and the second table is formed by a first component and a second component, and the thermal conductivity of the second component is made to be lower than the thermal conductivity of the first component while allowing the first component to contact the motor moving part and allowing the second component to contact the second table.

6. The stage device according to claim 5, wherein the second component contacting the second table is formed of a resin material or a ceramic material.

7. The stage device according to claim 6, wherein an area in which the second component contacts the second table is made to be wider than an area in which the second component contacts the first component while the second component contacting the second table is formed of a resin material.

8. The stage device according to claim 1, wherein the second table is formed of an aluminum alloy and a component formed of a ceramic material is connected on an upper surface thereof.

9. A charged particle beam device comprising:
a charged particle source;
a sample stage moving a sample to which a beam discharged from the charged particle source is applied; and
a vacuum chamber in which the sample stage is installed,
wherein the sample stage is formed by upper and lower two stages,
a slide unit is connected to a component which connects between a driving source and a table in a lower stage,
the slide unit has a structure of being constrained by a rail fixed to a base, and
the slide unit is arranged in a region where a place connecting to the lower-stage table is vertically projected to a plane on which the stage moves.

10. A stage device including a first table for placing a sample, a first drive mechanism moving the first table in a first direction, a second table for placing the first table and a second drive mechanism moving the second table in a second direction, the device comprising:
a first rail and a second rail guiding the second table to the second direction;
a third rail guiding the second table to the same direction as the first rail and the second rail;
a slide unit moving on the third rail together with the second table; and
a connecting member interposed between the second table and the second drive mechanism,
wherein the connecting member and the slide unit are arranged so that a virtual straight line extending in a third direction orthogonal to the first direction and the second direction passes therethrough.

11. The stage device according to claim 10, wherein the third rail is arranged between the first rail and the second rail.

* * * * *